US011329023B2

(12) United States Patent
Kostinovsky et al.

(10) Patent No.: US 11,329,023 B2
(45) Date of Patent: May 10, 2022

(54) INTERCONNECTION OF COPPER SURFACES USING COPPER SINTERING MATERIAL

(71) Applicant: Schlumberger Technology Corporation, Sugar Land, TX (US)

(72) Inventors: Mark Alex Kostinovsky, Houston, TX (US); Steven O. Dunford, Missouri City, TX (US); Lweness Mazari, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 89 days.

(21) Appl. No.: 17/001,110

(22) Filed: Aug. 24, 2020

(65) Prior Publication Data

US 2021/0320082 A1 Oct. 14, 2021

Related U.S. Application Data

(60) Provisional application No. 63/008,414, filed on Apr. 10, 2020.

(51) Int. Cl.
*H01L 23/52* (2006.01)
*H01L 23/00* (2006.01)

(52) U.S. Cl.
CPC .............. *H01L 24/83* (2013.01); *H01L 24/29* (2013.01); *H01L 24/32* (2013.01); *H01L 2224/29247* (2013.01); *H01L 2224/32227* (2013.01); *H01L 2224/8384* (2013.01); *H01L 2224/83359* (2013.01); *H01L 2924/0103* (2013.01); *H01L 2924/01004* (2013.01); *H01L 2924/0105* (2013.01); *H01L 2924/01012* (2013.01); *H01L 2924/01014* (2013.01); *H01L 2924/01015* (2013.01); *H01L 2924/01025* (2013.01); *H01L 2924/01026* (2013.01);
(Continued)

(58) Field of Classification Search
CPC ......... H01L 24/29; H01L 24/32; H01L 24/83; H01L 2224/29247; H01L 2224/32227; H01L 2224/83359; H01L 2224/8384; H01L 2924/01004; H01L 2924/01012; H01L 2924/01014
USPC ........................................................ 257/782
See application file for complete search history.

(56) References Cited

U.S. PATENT DOCUMENTS 5,858,074 A 1/1999 Cole et al.
7,547,625 B2 * 6/2009 Beyne ................ B81C 1/00333
438/612

(Continued)

FOREIGN PATENT DOCUMENTS

WO 2007102062 A2 9/2007

OTHER PUBLICATIONS

Schnabl et al., Sintered Copper material: Nanocopper Based Solder-Free Electronic Assembly, Journal of Electronic Materials, vol. 43, No. 12, 2014, pp. 4515-4521.

Primary Examiner — Luan C Thai

(57) ABSTRACT

A method for interconnecting a first conductor and a second conductor includes forming a layer of substantially pure copper on the first conductor, applying a copper sintering material to the first conductor, the second conductor, or both, and interconnecting the first conductor and the second conductor by sintering the copper sintering material so as to form a copper-copper interface that includes the layer of substantially pure copper, the second conductor, and the copper sintering material.

20 Claims, 3 Drawing Sheets

(52) U.S. Cl.
CPC ............... *H01L 2924/01028* (2013.01); *H01L 2924/01029* (2013.01); *H01L 2924/01082* (2013.01)

(56) References Cited

U.S. PATENT DOCUMENTS

| | | |
|---|---|---|
| 7,566,592 B2 | 7/2009 | Sato et al. |
| 8,105,414 B2 | 1/2012 | Zinn |
| 8,970,035 B2 * | 3/2015 | Lin .................. H01L 24/13 257/737 |
| 10,566,103 B2 | 2/2020 | Shah et al. |
| 2010/0164098 A1 * | 7/2010 | Kuechenmeister ..... H01L 24/16 257/737 |

* cited by examiner

INTERCONNECTION OF COPPER SURFACES USING COPPER SINTERING MATERIAL

CROSS-REFERENCE TO RELATED APPLICATION(S)

This disclosure claims priority from U.S. Provisional Appl. No. 63/008,414 filed on Apr. 10, 2020, entitled "INTERCONNECTIONS OF SOLDERABLE COPPER SURFACES", herein incorporated by reference in its entirety.

BACKGROUND

Interconnections of electronic components to printed circuit or wiring boards may be completed by soldering the components, using various different types of solder alloys. The solder makes connection to the components and circuits through copper pads. The copper pads on the circuit boards are generally protected from oxidation or corrosion using various techniques including immersion silver, immersion tin, electroless nickel immersion gold (ENIG), electroless nickel immersion palladium immersion gold (ENIPIG), electroless nickel electroless palladium immersion gold (ENEPIG), tin over nickel, various solder alloys, organic solder preservative (OSP), etc. Component leads or solder pads are generally protected from oxidation or corrosion using similar coatings such as tin plating, tin-lead plating, tin over nickel plating, electrolytic gold over nickel plating, ENIG, ENIPG, ENEPIG, various solder alloys, OSP, etc. Each of these coatings generally have drawbacks in terms of aging and reliability or others, and/or for the process used to apply these coatings.

For example, gold plating of nickel-plated conductors for solder joints has several drawbacks. When the solder joint is created using the gold-plated surfaces, the solder joints can include excess gold intermetallic compounds (IMCs). These gold IMCs are brittle and can lead to fracture of the solder joint. During ENIG and sometimes ENIPIG processing, there is a risk of hyper-corrosion of the nickel during the immersion gold-plating process. The immersion gold process can remove the nickel which can create a "black pad" that prevents the formation of IMCs at the nickel interface, which are integral to the formation of a solder joint. Thicker gold layers applied using the immersion gold-plating process have a higher potential for hyper-corrosion, while thinner immersion gold layers have a higher potential for allowing oxidation of the underlying nickel layer. Complicating the matter further, the detection of black pad conditions may be difficult and may require destructive testing. Additionally, gold plating carries a relatively high cost.

Furthermore, solder used in high-temperature applications, such as in electronics used in an oil and gas well, can present additional difficulties. In particular, the solder may be made of materials that melt at relatively low temperatures, which can lead to reflow of the solder and potential disconnection of soldered components during use in the high-temperature applications. High-performance solder materials can be used, which melt at higher temperatures, but these materials may impair conductivity or may be difficult to raise to the melting temperature without damaging the surrounding electrical components.

One way this has been avoided is through the use of transient liquid phase sintering (TLPS). Sintered materials are generally a combination of nano-powders with different melting temperatures in a liquid carrier to prevent oxidation and/or spontaneous reaction of the very small particles, for example, a fluxing agent. When heated, with or without pressure, the high melting point materials become soluble in the low melting point materials and coalesce, thereby coupling the leads together. When cooled, the materials form a solid interconnection with melting point greater than the original low melting point material. Heating can be accomplished with many heat sources such as a laser or a reflow oven. The examples are subject to the electrical, thermal, and mechanical limitations of the materials combined in the process of creating the electrical interconnections. Because they are a combination of metals, each process forms brittle intermetallic compounds and may have defects such as voids as a result of diffusion reactions such as the Kirkendall or Horsting effect. Limitations may also include reduced mechanical properties due to grain growth, boundary locations, distortions, and IMC growth.

SUMMARY

Embodiments of the disclosure provide a method for interconnecting a first conductor and a second conductor. The method includes forming a layer of substantially pure copper on the first conductor, applying a copper sintering material to the first conductor, the second conductor, or both, and interconnecting the first conductor and the second conductor by sintering the copper sintering material so as to form a copper-copper interface that includes the layer of substantially pure copper, the second conductor, and the copper sintering material.

Embodiments of the disclosure further provide an electrical device including a component with a first conductor and a substantially pure copper layer plated on the first conductor, and a circuit board including a second conductor comprising copper, and a sintered joint including a copper sintering material, the sintered joint interconnecting the first and second conductors by forming a copper-copper interface between the second conductor and the substantially pure copper layer.

Embodiments of the disclosure also provide a method for interconnecting two conductors. The method includes forming one or more substantially pure copper layers on a first conductor, the first conductor including an alloy of copper and another element or an iron-lead alloy over which the one or more substantially pure copper layers are formed. The method further includes forming a first protective layer on the first conductor, over the one or more copper layers, and forming a second protective layer on a second conductor, the second conductor comprising a substantially pure copper. The first and second protective layers prevent the first conductor, the second conductor, the one or more copper layers, or a combination thereof from oxidation. The method also includes applying a copper sintering paste to the first conductor, the second conductor, or both after forming the first and second protective layers, and interconnecting the first conductor and the second conductor by sintering the copper sintering paste so as to form a copper-copper interface including the one or more substantially pure copper layers on the first conductor, the copper sintering paste, and the second conductor. The interface is substantially free from intermetallic compounds.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Figure 1:
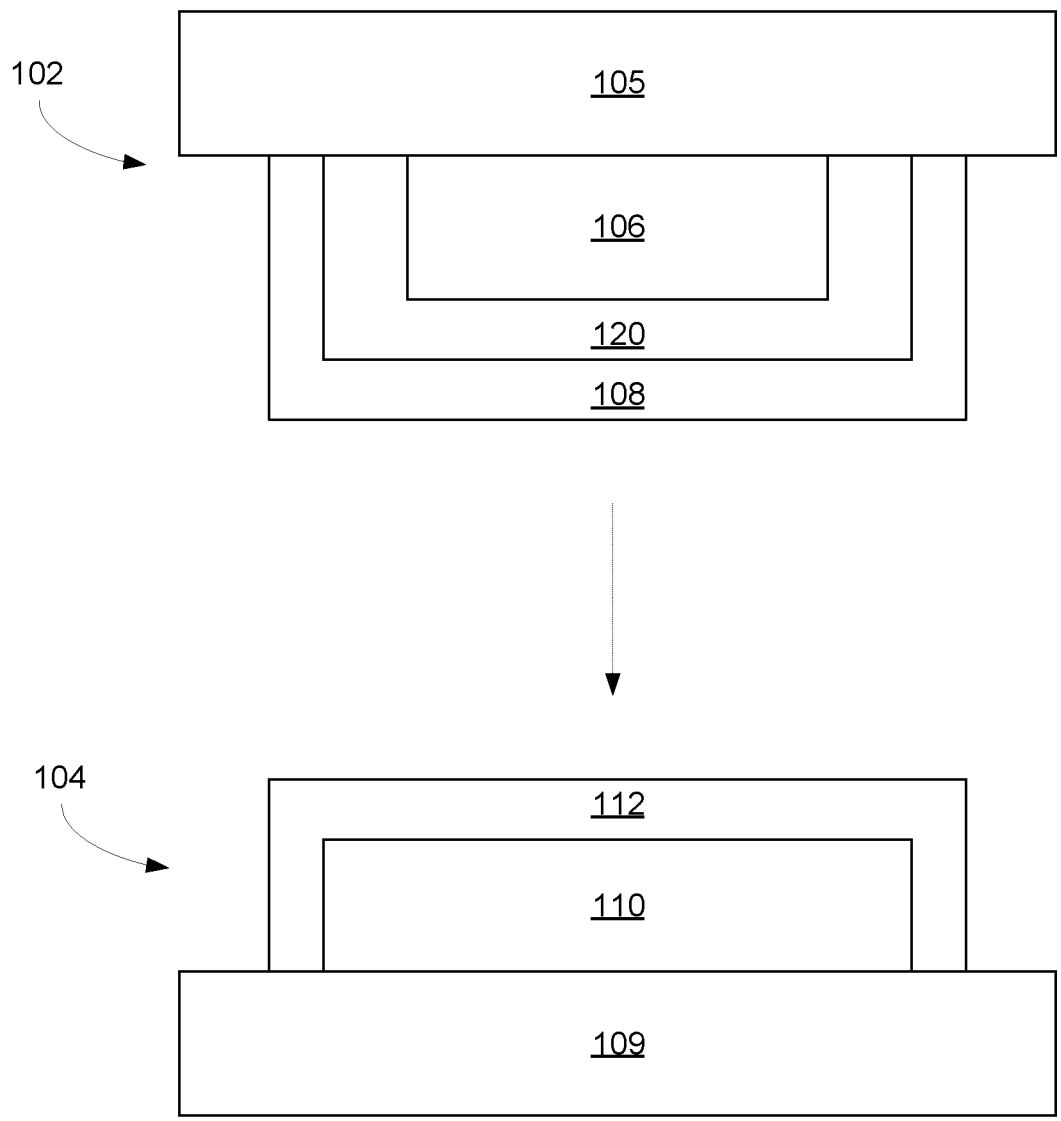
FIG. 1 illustrates a simplified, schematic view of an electrical component and a circuit board which may be connected together as diagrammatically represented, according to an embodiment.

Embodiments of the present disclosure may provide an interconnection of two conductors using a copper sintering material (e.g., paste) and a protective layer, at least. The conductors and the sintering paste may include copper. Upon sintering the sintering paste, a generally consistent copper interface is formed between the conductors. Further, the protective layer on the conductors, applied prior to the sintering paste, may prevent oxidation of the copper of the conductors prior to forming the sintered connection.

In some embodiments, one or both of the conductors may be formed from a copper alloy, i.e., copper and at least one other element. The copper alloy may be incompatible with the sintering material and might result in a poor connection if the copper alloy were used directly with the sintering material. Accordingly, the present disclosure may provide a copper layer formed (e.g., plated) on the conductor(s) having the copper-alloy. The copper layer may be substantially pure copper and may thus form a strong connection by sintering the copper sintering paste.

The following disclosure describes several embodiments for implementing different features, structures, or functions of the invention. Embodiments of components, arrangements, and configurations are described below to simplify the present disclosure; however, these embodiments are provided merely as examples and are not intended to limit the scope of the invention. Additionally, the present disclosure may repeat reference characters (e.g., numerals) and/or letters in the various embodiments and across the Figures provided herein. This repetition is for the purpose of simplicity and clarity and does not in itself dictate a relationship between the various embodiments and/or configurations discussed in the Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the embodiments presented below may be combined in any combination of ways, e.g., any element from one embodiment may be used in any other embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Additionally, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. In addition, unless otherwise provided herein, "or" statements are intended to be non-exclusive; for example, the statement "A or B" should be considered to mean "A, B, or both A and B."

FIG. 1 illustrates a simplified, schematic view of an electrical component 102 and a circuit board 104, which may be connected together as diagrammatically represented, according to an embodiment. It will be appreciated that the view of FIG. 1 is not drawn to scale, and the layers that will be described herein below may be exaggerated in thickness for ease of description. For example, electrical component 102 may be or include flip chip die or through silicon via, chip scale packaging, or semiconductors packaged in ceramics and plastic encapsulation materials, or the like.

Accordingly, the electrical component 102 may include a substrate 105 and a first conductor 106 connected thereto (e.g., formed thereon, recessed therein, etc.). The substrate 105 may generally be the body of the electrical component 102, and may be formed from a plastic.

The first conductor 106 may be made of copper or a copper alloy including at least one other element, such as iron, nickel, phosphorus, magnesium, manganese, zinc, tin, silicon, beryllium, lead, or others. The other element(s) may form a relatively small amount of the alloy, e.g., between about 0.5 wt % and about 3 wt %, or about 1 wt %, to name a few illustrative examples. The first conductor 106 may be or include a pin or another lead configured to be coupled to the circuit board 104, as will be described below. It will be appreciated that the use of the terms "first" and "second" to identify components are used herein as a naming convention to distinguish between two components and not to imply any particular number of components, e.g., a second component may be present without a first component and vice versa.

The electrical component 102 may also include a first protective layer 108 that may be formed over the first conductor 106. The first protective layer 108 may be configured to prevent the copper of the first conductor 106 from oxidation. The first protective layer 108 may not include gold or nickel but may instead be or include an organic solderability preservative (OSP) and/or another nitrogen-containing molecule. In the latter example, the first protective layer 108 may be or include one or more barrier layers including all or a portion of a reactive nitrogen-containing molecule deposited onto the surface of the first conductor 106. In various embodiments, the nitrogen-containing molecule can include primary, secondary, or tertiary nitrogen(s) covalently bound to carbon. The nitrogen may be present as a substituted aliphatic hydrocarbon or a substituted aromatic hydrocarbon. According to some embodiments, nitrogen can include a substituted siloxane with the nitrogen covalently bound to silicon or with a nitrogen covalently bound to a carbon group which is covalently bound to silicon. The first protective layer 108 may thus passivate the first conductor 106. In other embodiments, other types of materials may be used for the first protective layer 108. The first protective layer 108 may be formed or otherwise created in any suitable manner, such as by immersion of the surface of the first conductor 106, spraying onto the first conductor 106, brushing thereon, etc.

The circuit board 104 may include a substrate 109, which may be or include any material that contains or supports interconnecting circuitry including, for example, fiber-reinforced organic polymers, non-reinforced polymers, ceramics, silicon, glass or other non-conductive materials.

The circuit board 104 may include a second conductor 110. The second conductor 110 may be a pad, wire, through-hole surface, pin, or the like. Further, the second conductor 110 may be coupled to the substrate 109, e.g., extending therefrom or recessed therein without limitation. The second conductor 110 may generally be a pure copper, but could also a copper-alloy, e.g., including at least one other element, such as iron, nickel, magnesium, manganese, zinc, tin, silicon, or others, in addition to the copper and in a relatively small amount compared to the copper (e.g., between about 0.5 wt % and about 3 wt %, or about 1 wt %, to name a few illustrative examples).

A second protective layer 112 may be formed on the second conductor 110 to prevent the copper of the second conductor 110 from oxidation. The second protective layer 112 may not include gold or nickel, but instead may include a material such as that described above for the first protective layer 108, although it will be appreciated that the protective layers 108, 112 may not be formed from the same material in a given embodiment.

In embodiments in which one or both of the conductors 106, 110 are at least partially made of a copper-alloy rather than pure copper, a layer of substantially pure (e.g., potentially including trace amounts of other elements) copper may be formed over the copper-alloy of the conductor(s) 106, 110. For example, in the illustrated embodiment, the first conductor 106 may be made at least partially of copper-alloy. Accordingly, the component 102 includes a copper layer 120 formed on the outer surface of the first conductor 106, e.g., between the protective layer 108 and the first conductor 106. The copper layer 120 may be configured to promote adhesion during a subsequent sintering process, using copper sintering material, as will be described in greater detail below. The copper layer 120 may be, for example, plated on the first conductor 106 prior to application of the protective layer 108. It will be appreciated that a similar copper layer may be plated or otherwise formed on the second conductor 110, e.g., in an embodiment in which the second conductor 110 includes a copper-alloy.

In another embodiment, the substrates 105, 109 may be ceramic, and the first and/or second conductors 106, 110 may be made from an iron-nickel. In order to interconnect the first and second conductors 106, 110 using the sintering paste 202, the first and/or second conductors 106, 110 may first be plated with electrolytic or electroless copper, e.g., forming the copper layer 120 discussed above. The sintering may then proceed by applying and heating the sintering paste 202, as also discussed above, to form the same strong copper-copper joint.

Figure 2:
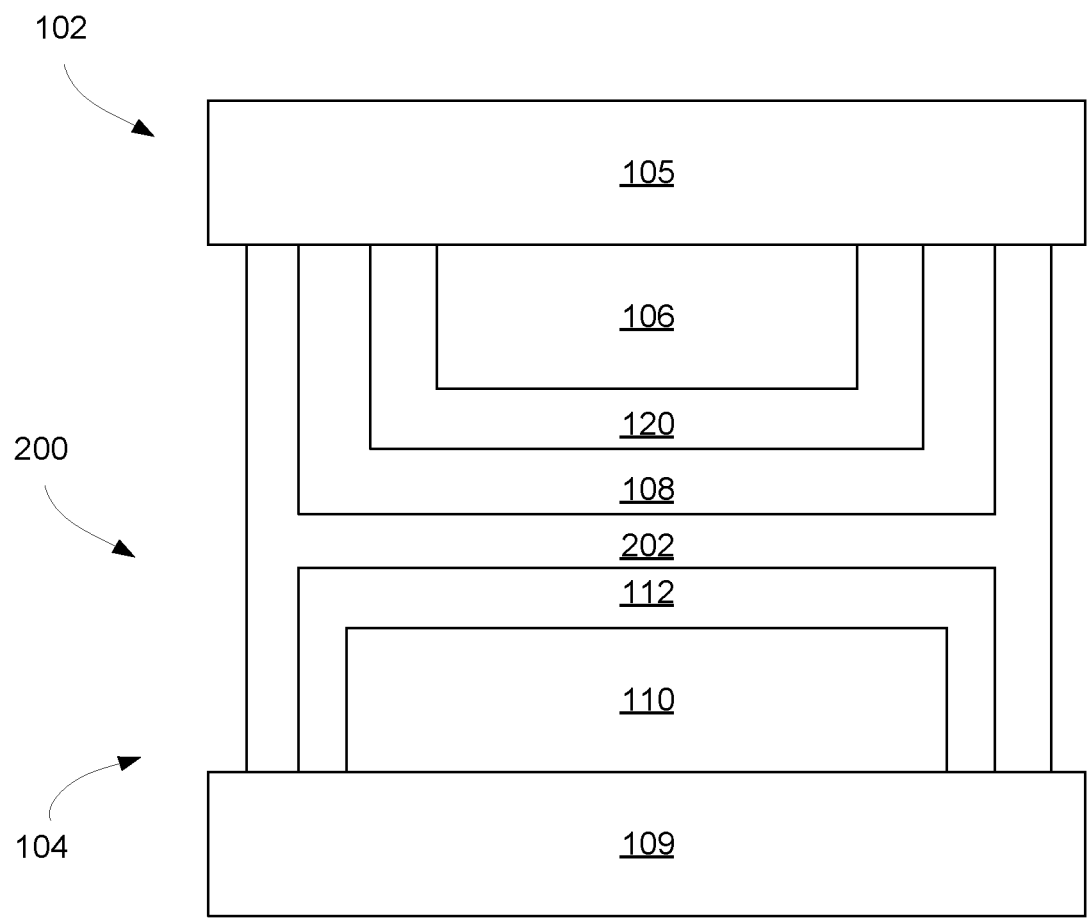
FIG. 2 illustrates a simplified, schematic view of the component connected to the circuit board, e.g., such that a sintered joint is formed that interconnects the first and second conductors, according to an embodiment.

FIG. 2 illustrates a simplified, schematic view of the component 102 connected to the circuit board 104, e.g., such that a sintered joint 200 is formed that interconnects the first and second conductors 106, 110, according to an embodiment. To form the sintered joint 200, a copper sintering material, e.g., a copper sintering paste 202 is applied to either or both of the first and second conductors 106, 110. For example, the copper sintering paste 202 may be applied on top of the second protective layer 112 of the circuit board 104 in anticipation of connection to the first conductor 106 but could instead or additionally be applied to the first conductor 106.

In some embodiments, the copper sintering paste 202 may include copper nanoparticles and a grain growth inhibitor or a precursor to a grain growth inhibitor admixed with the copper nanoparticles. The grain growth inhibitor may include a metal such as aluminum, titanium, tantalum, zirconium, or hafnium). The grain growth inhibitor may further be insoluble in a bulk copper matrix and capable of residing at one or more grain boundaries in the bulk copper matrix. The one or more grain boundaries may be formed after the copper nanoparticles undergo consolidation to form bulk copper, e.g., during the sintering process. In some embodiments, other types of copper sintering paste may be employed; thus, the above copper-nanoparticle paste is merely an example.

Once the copper sintering paste 202 is in place and the first and second conductors 106, 110 are positioned, the first and second conductors 106, 110 may be sintered together, e.g., by directing a laser or another heat source to the sintering paste 202. This may cause the sintering paste 202 to solidify and interconnect the first and second conductors 106, 110. In cases where the conductors 106 and/or 110 are copper-alloy, and a copper plating layer is provided, the interconnection of the first and second conductors 106, 110 is via the sintering of the copper plating layer 120. In a specific example, the first conductor 106 is plated with the copper plating layer 120, and the first conductor 106 is interconnected with the second conductor 110 by sintering the copper plating layer 120 directly to the second conductor 110 using the sintering paste 202.

In these examples, since there is no gold or other metals in contact with the sintering paste 202, brittle gold IMCs and potentially any other IMCs may be avoided in the sintered joint 200. The result may be a copper-only interface, e.g., copper-copper-copper between the first conductor 106, the second conductor 110 (or the copper layers thereon), and the copper sintering paste 202.

Figure 3:
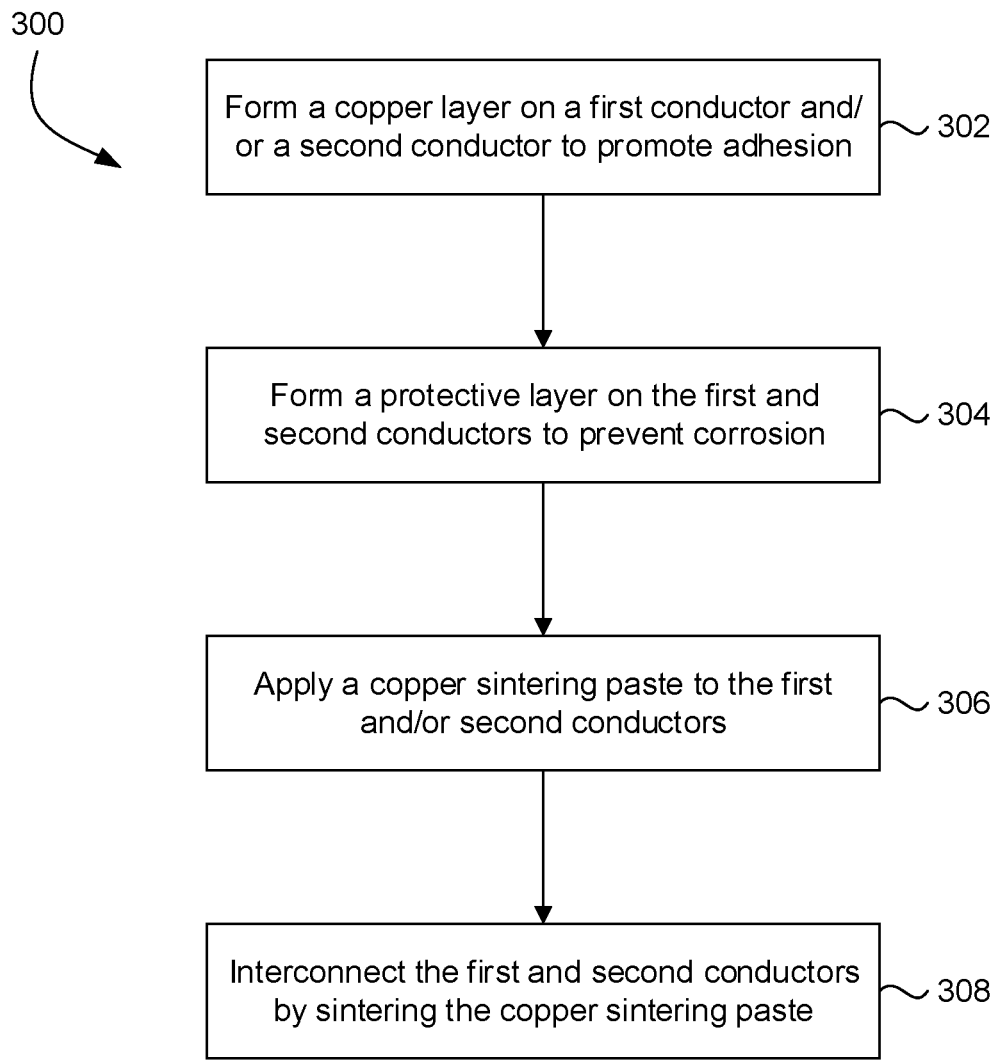
FIG. 3 illustrates a flowchart of a method for interconnecting two conductors, according to an embodiment.

FIG. 3 illustrates a flowchart of a method 300 for interconnecting two conductors 106, 110, according to an embodiment. The method 300 may include forming one or more copper layers on the first conductor 106, the second conductor 110, or both, as at 302. For example, the first and/or second conductor 106, 110 may be made at least partially from a copper alloy. The copper layer may be provided (e.g., plated onto the conductor(s) 106, 110) to promote adhesion thereof to a copper sintering material. In other embodiments, the conductors 106, 110 may include copper, rather than copper alloy, and thus the copper layer may be omitted.

The method 300 may also include forming a protective layer 108 on the first conductor 106, a protective layer 112 on the second conductor 110, or both, as at 304. The protective layers 108, 112 may be formed on (at least partially covering) substantially pure, adhesion-promoting the copper layer, if present, or otherwise formed directly on the conductors 106, 110, respectively.

The method 300 may also include applying a copper sintering paste 202 to the first conductor 106, the second conductor 110, or both after forming the protective layers 108, 112, as at 306. For example, the copper sintering past 202 may include copper nanotubes, and may be configured to form into a solid upon application of heat and/or pressure. Applying the copper sintering paste 202 may proceed by applying the copper sintering paste 202 over the protective layer(s) 108 and/or 112.

The method 300 may then include interconnecting the first conductor 106 and the second conductor 110 by sintering the copper sintering paste, as at 308. Sintering may include forming a copper interface between the first conductor 106 and the second conductor 110.

Accordingly, it will be seen that embodiments of the present disclosure may avoid constructions of solder joints (made of different alloys) on circuit assemblies. Instead, sintered copper connections may be formed. As a result, in at least some embodiments, the electronic components may not include metal plating to protect solderability. Further, since ENIG in particular is avoided, the risk of hypercorrosion of the nickel-based surfaces during the ENIG process is likewise obviated. Additionally, the costs associated with gold plating may also be avoided. Where appropriate, the provision of the copper layer (e.g., plated over the conductors) may permit for conductor compositions that may not otherwise adhere well in the copper sintering material to be used.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods are illustrated and described may be re-arranged, and/or two or more elements may occur simultaneously. The embodiments were chosen and described in order to best explain the principals of the invention and its practical applications, to thereby enable others skilled in the art to best utilize the invention and various embodiments with various modifications as are suited to the particular use contemplated.

The invention claimed is:

1. A method for interconnecting a first conductor and a second conductor, comprising:
   forming a layer of substantially pure copper on the first conductor;
   applying a copper sintering material to the first conductor, the second conductor, or both; and
   interconnecting the first conductor and the second conductor by sintering the copper sintering material so as to form a copper-copper interface that includes the layer of substantially pure copper, the second conductor, and the copper sintering material.

2. The method of claim 1, wherein the method does not include plating the first conductor or the second conductor with gold or nickel.

3. The method of claim 1, wherein the first conductor comprises an alloy of copper and another element, and wherein forming the layer of substantially pure copper on the first conductor comprises plating the first conductor with the substantially pure copper layer prior to applying the copper sintering material.

4. The method of claim 3, wherein the other element is selected from the group consisting of iron, nickel, magnesium, manganese, phosphorus, lead, beryllium, zinc, tin, and silicon.

5. The method of claim 1, wherein the second conductor comprises a solder pad of a printed circuit board, and wherein the first conductor comprises a lead of an electrical component that is electrically and physically coupled to the printed circuit board by sintering the copper sintering material.

6. The method of claim 1, wherein the copper-copper interface is substantially free of intermetallic compounds.

7. The method of claim 1, further comprising forming a protective layer on the first conductor, the protective layer being configured to prevent the first conductor, the layer of substantially pure copper, or both from oxidation.

8. The method of claim 7, wherein the protective layer comprises an organic solderability preservative, a nitrogen-containing molecule, or both.

9. The method of claim 1, wherein the first conductor comprises an iron-nickel alloy applied to a ceramic substrate.

10. An electrical device, comprising:
    a component comprising a first conductor and a substantially pure copper layer plated on the first conductor; and
    a circuit board comprising a second conductor comprising copper; and
    a sintered joint comprising a copper sintering material, the sintered joint interconnecting the first and second conductors by forming a copper-copper interface between the second conductor and the substantially pure copper layer.

11. The electrical device of claim 10, further comprising a first protective layer over the copper layer, to prevent the copper layer from oxidizing, and a second protective layer over the second conductor, to prevent the second conductor from oxidizing.

12. The electrical device of claim 11, wherein neither the first protective layer nor the second protective layer comprises gold or nickel.

13. The electrical device of claim 11, wherein the first protective layer and the second protective layer each include a material having a nitrogen-containing molecule, an organic solderability preservative, or both.

14. The electrical device of claim 10, wherein the sintered joint does not include gold intermetallic compounds.

15. The electrical device of claim 10, wherein the first conductor comprises an alloy of the copper and another element.

16. The electrical device of claim 15, wherein the other element is selected from the group consisting of: iron, nickel, magnesium, manganese, phosphorus, lead, beryllium, zinc, tin, and silicon.

17. The electrical device of claim 10, wherein the first conductor comprises an alloy of iron and nickel formed on a ceramic substrate.

18. The electrical device of claim 10, wherein the electrical device is contained within a downhole tool configured to be deployed into a wellbore.

19. The electrical device of claim 10, wherein the copper sintering material comprises copper nanoparticles.

20. A method for interconnecting two conductors, comprising:
    forming one or more substantially pure copper layers on a first conductor, the first conductor comprising an alloy of copper and another element or an iron-lead alloy over which the one or more substantially pure copper layers are formed;
    forming a first protective layer on the first conductor, over the one or more copper layers, and forming a second protective layer on a second conductor, the second conductor comprising a substantially pure copper, wherein the first and second protective layers prevent the first conductor, the second conductor, the one or more copper layers, or a combination thereof from oxidation;

applying a copper sintering paste to the first conductor, the second conductor, or both after forming the first and second protective layers; and interconnecting the first conductor and the second conductor by sintering the copper sintering paste so as to form a copper-copper interface comprising the one or more substantially pure copper layers on the first conductor, the copper sintering paste, and the second conductor, wherein the interface is substantially free from intermetallic compounds.

\* \* \* \* \*